(12) United States Patent
Kwag et al.

(10) Patent No.: US 11,715,811 B2
(45) Date of Patent: Aug. 1, 2023

(54) LIGHT EMITTING DIODE TRANSFER SYSTEM AND CONTROL METHOD THEREOF

(71) Applicant: SAMSUNG ELECTRONICS CO., LTD., Suwon-si (KR)

(72) Inventors: Doyoung Kwag, Suwon-si (KR); Byungchul Kim, Suwon-si (KR); Sangmoo Park, Suwon-si (KR); Minsub Oh, Seoul (KR); Wonsik Choi, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 420 days.

(21) Appl. No.: 17/133,171

(22) Filed: Dec. 23, 2020

(65) Prior Publication Data

US 2021/0202787 A1   Jul. 1, 2021

(30) Foreign Application Priority Data

Dec. 26, 2019 (KR) .................. 10-2019-0175325

(51) Int. Cl.
*H01L 33/00* (2010.01)
*H01L 25/075* (2006.01)

(52) U.S. Cl.
CPC .......... *H01L 33/005* (2013.01); *H01L 25/075* (2013.01); *H01L 25/0753* (2013.01)

(58) Field of Classification Search
CPC . H01L 33/005; H01L 25/075; H01L 25/0753; H01L 2221/00; H01L 2221/67
See application file for complete search history.

(56) References Cited

U.S. PATENT DOCUMENTS 9,368,745 B2   6/2016   Lee et al.
9,954,042 B2   4/2018   Lee et al.
(Continued)

FOREIGN PATENT DOCUMENTS

CN   110088920 A   8/2019
JP   2001102171 A   4/2001
(Continued)

OTHER PUBLICATIONS

International Search Report (PCT/ISA/210) and Written Opinion (PCT/ISA/237) dated Apr. 19, 2021 issued by the International Searching Authority in International Application No. PCT/KR2020/018710.

*Primary Examiner* — Anne M Hines
(74) *Attorney, Agent, or Firm* — Sughrue Mion, PLLC

(57) ABSTRACT

A light emitting diode (LED) transfer system includes an alignment apparatus configured to align a plurality of target substrates; a handling robot configured to transport the plurality of target substrates; a transfer stage configured to hold the plurality of target substrates and move the plurality of target substrates; a substrate stage configured to move a relay substrate having a plurality of LEDs with respect to the transfer stage while the plurality of LEDs are facing the transfer stage; a laser configured to emit a laser beam toward the plurality of LEDs of the relay substrate so that the plurality of LEDs are transferred from the relay substrate to the plurality of target substrates; and a processor configured to control the alignment apparatus, the handling robot, the transfer stage, the substrate stage, and the laser to transfer the plurality of LEDs of the relay substrate to the plurality of target substrates.

16 Claims, 14 Drawing Sheets

(56) References Cited

U.S. PATENT DOCUMENTS

| | | |
|---|---|---|
| 16,755,958 | 8/2020 | Arai |
| 2008/0013089 A1 | 1/2008 | Ishii et al. |
| 2013/0077078 A1 | 3/2013 | Lafarre et al. |
| 2014/0138646 A1 | 5/2014 | Lee et al. |
| 2016/0284775 A1 | 9/2016 | Lee et al. |
| 2017/0309698 A1 | 10/2017 | Bower et al. |
| 2018/0069147 A1* | 3/2018 | Hoeppel ............. H01L 33/0093 |
| 2019/0043843 A1 | 2/2019 | Liu et al. |
| 2019/0189685 A1 | 6/2019 | Thothadri et al. |
| 2019/0221466 A1 | 7/2019 | Arai |

FOREIGN PATENT DOCUMENTS

| | | |
|---|---|---|
| JP | 2013-70038 A | 4/2013 |
| JP | 2018-60993 A | 4/2018 |
| KR | 10-2007-0048650 A | 5/2007 |
| KR | 1020140065284 A | 5/2014 |
| KR | 10-2018-0120527 A | 11/2018 |
| KR | 10-1959057 B1 | 3/2019 |
| KR | 10-2019-0109078 A | 9/2019 |
| WO | 2018038967 A1 | 3/2018 |

* cited by examiner

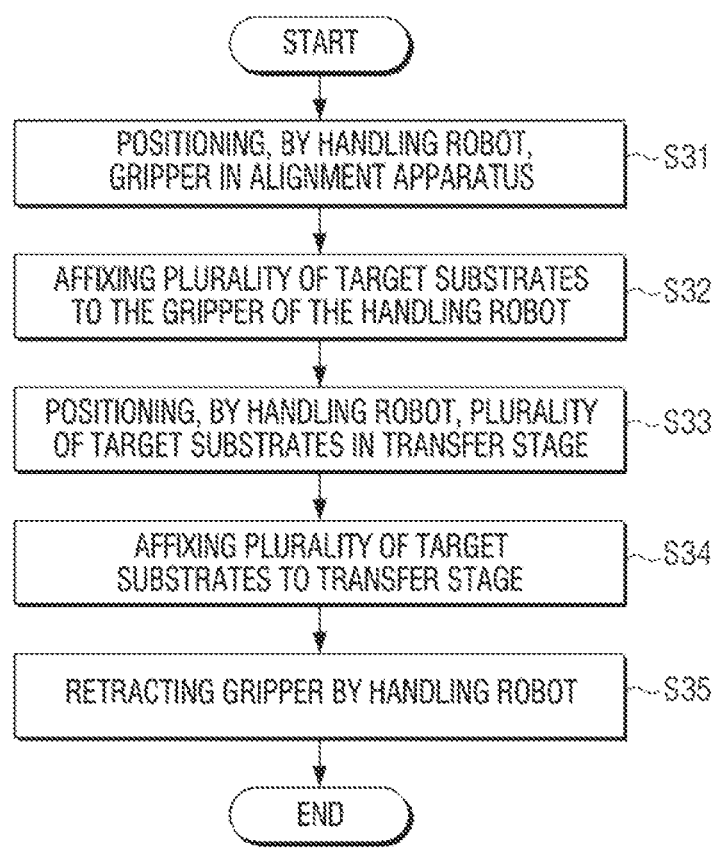

LIGHT EMITTING DIODE TRANSFER SYSTEM AND CONTROL METHOD THEREOF

CROSS-REFERENCE TO RELATED APPLICATIONS

This application is based on and claims priority under 35 U.S.C. § 119 to Korean Patent Application No. 10-2019-0175325, filed on Dec. 26, 2019, in the Korean Intellectual Property Office, the disclosure of which is incorporated by reference herein in its entirety.

BACKGROUND

1. Field

The disclosure relates to manifesting LED displays, and more particularly to a light emitting diode (LED) transfer system and a control method of the LED transfer system.

2. Description of the Related Art

A light emitting diode (LED) is an ultra-small inorganic light emitting material that emits light without a color filter and backlight.

A plurality of LEDs are manufactured by growing in a chip shape on a wafer (a growth substrate) through an epitaxial process or the like. The plurality of LEDs manufactured in this way may be transferred onto a target substrate, thereby constituting a display module.

However, red LEDs that emit red light R, green LEDs that emit green light G, and blue LEDs that emit blue light B are formed on different wafers.

Accordingly, in the transfer process, LEDs are sequentially transferred to the target substrate for each color from a wafer on which a plurality of red LEDs only are formed, a wafer on which a plurality of green LEDs only are formed, and a wafer on which a plurality of blue LEDs only are formed.

In other words, when the wafer on which one color LEDs are formed is moved to a transfer position and the transfer of the moved one color LEDs is completed, the wafer at the transfer position is replaced with a wafer on which LEDs of another color are formed. Accordingly, the transfer time for transferring the LEDs onto the target substrate is increased. Therefore, there is a problem in that the total manufacturing time of the display module increases due to this.

SUMMARY

According to an aspect of the disclosure, a light emitting diode transfer system may include an alignment apparatus configured to align a plurality of target substrates; a handling robot configured to transport the plurality of target substrates aligned in the alignment apparatus while maintaining an aligned state; a transfer stage configured to hold the plurality of target substrates transported by the handling robot and move the plurality of target substrates; a substrate stage configured to move a relay substrate having a plurality of light emitting diodes (LEDs) to be transferred to the plurality of target substrates with respect to the transfer stage while the plurality of LEDs are facing the transfer stage; a laser configured to emit a laser beam toward the plurality of LEDs of the relay substrate disposed on the substrate stage so that the plurality of LEDs are transferred from the relay substrate to the plurality of target substrates; and a processor configured to control the alignment apparatus, the handling robot, the transfer stage, the substrate stage, and the laser to transfer the plurality of LEDs of the relay substrate to the plurality of target substrates.

The alignment apparatus may include a base; and a plurality of alignment supports provided on an upper side of the base, and configured to support the plurality of target substrates and adjust each of the plurality of target substrates in an X-axis direction, a Y-axis direction, a Z-axis direction, and a θ direction.

Each of the plurality of alignment supports may include a plurality of pins that affix a target substrate to the base and space the affixed target substrate from the base.

The plurality of pins may adsorb and affix the plurality of target substrates by vacuum suction.

The handling robot may include a gripper capable of gripping each of the plurality of target substrates at once.

The gripper may be configured to adsorb the target substrates without contacting a plurality of pins that protrude from a base of the alignment apparatus and support the plurality of target substrates.

The gripper may adsorb and affix the plurality of target substrates by vacuum suction.

The transfer stage may include a transfer base configured to be movable in an X-axis direction and a Y-axis direction; and a plurality of fixing pins protruding from the transfer base and configured to affix the plurality of target substrates transported by the handling robot.

The plurality of fixing pins may adsorb and affix the plurality of target substrates by vacuum suction.

The transfer stage further comprises a image sensor for aligning the plurality of target substrates, affixed by the plurality of fixing pins, with respect to the laser.

The processor may control the transfer stage so that the plurality of target substrates are moved along a zigzag path with respect to the laser. A moving length of the zigzag path in an X-axis direction may correspond to a length of at least two target substrates aligned in the X-axis direction among the plurality of target substrates, and a moving length of the zigzag path in a Y-axis direction may correspond to a vertical distance between adjacent connection terminals of the plurality of target substrates.

The processor may be further configured to control the transfer stage, the substrate stage, and the laser to sequentially transfer a plurality of red LEDs, a plurality of green LEDs, and a plurality of blue LEDs to the plurality of target substrates.

According to another aspect of the disclosure, a control method of a light emitting diode transfer system may include loading a plurality of target substrates onto an alignment apparatus; aligning the plurality of target substrates by the alignment apparatus; transporting, by a handling robot, the plurality of target substrates aligned by the alignment apparatus to a transfer stage while maintaining an aligned state; and transferring a plurality of light emitting diodes (LEDs) on a substrate stage to the plurality of target substrates of the transfer stage by operating a laser the substrate stage, and the transfer stage.

The transporting, by the handling robot, the plurality of target substrates aligned by the alignment apparatus to the transfer stage while maintaining the aligned state may include positioning, by the handling robot, a gripper under the plurality of target substrates aligned in the alignment apparatus; affixing the plurality of target substrates to the gripper; moving, by the handling robot, the gripper to position the plurality of target substrates in the transfer stage; affixing the plurality of target substrates to the transfer stage; and retracting the gripper by the handling robot.

The transferring the plurality of LEDs affixed to the substrate stage to the plurality of target substrates of the transfer stage may include a first transfer operation of transferring a plurality of LEDs of a relay substrate to a first row of the plurality of target substrates by emitting a laser beam from the laser while the plurality of target substrates are moving in a first direction from a front end of a first target substrate of at least two target substrates aligned in the first direction among the plurality of target substrates to a rear end of a last target substrate thereof of the at least two target substrates aligned in the first direction; a first moving operation of moving the plurality of target substrates by a predetermined distance in a second direction perpendicular to the first direction; a second transfer operation of transferring a plurality of LEDs of the relay substrate to a second row of the plurality of target substrates by emitting a laser beam from the laser apparatus while the plurality of target substrates are moving in a direction opposite to the first direction from the rear end of the last target substrate to the front end of the first target substrate; a second moving operation of moving the plurality of target substrates by the predetermined distance in the second direction; and repeating the first transfer operation, the first moving operation, the second transfer operation, and the second moving operation until LEDs are transferred to all the plurality of target substrates.

According to another aspect of the disclosure, a non-transitory computer-readable recording medium may include a program for executing a control method of a light emitting diode (LED) transfer system, wherein the control method of the LED transfer system may include loading a plurality of target substrates onto an alignment apparatus; aligning the plurality of target substrates by the alignment apparatus; transporting, by a handling robot, the plurality of target substrates aligned by the alignment apparatus to a transfer stage while maintaining an aligned state; and transferring a plurality of LEDs in a substrate stage to the plurality of target substrates of the transfer stage by operating a laser, the substrate stage, and the transfer stage.

BRIEF DESCRIPTION OF THE DRAWINGS

These and/or other aspects and advantages of the disclosure will become apparent and more readily appreciated from the following description of the embodiments, taken in conjunction with the accompanying drawings of which:

FIG. 14 is a flowchart illustrating a method for a handling robot to transport a plurality of target substrates from an alignment apparatus to a transfer stage in a control method of an LED transfer system according to an embodiment.

DETAILED DESCRIPTION OF THE EMBODIMENTS

Figure 1:
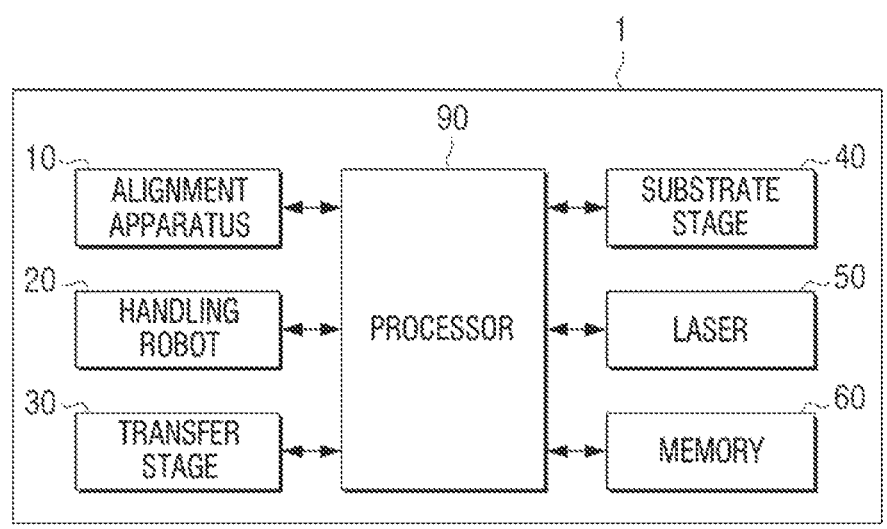
FIG. 1 is a block diagram schematically illustrating an LED transfer system according to an embodiment.

Various example embodiments of the disclosure will hereinafter be described with reference to the accompanying drawings. However, it is to be understood that technologies mentioned in the disclosure are not limited to specific embodiments, but include various modifications, equivalents, and/or alternatives according to embodiments of the disclosure. The matters defined herein, such as a detailed construction and elements thereof, are provided to assist in a comprehensive understanding of this description. Thus, it is apparent that exemplary embodiments may be carried out without those defined matters. Also, well-known functions or constructions are omitted to provide a clear and concise description of exemplary embodiments. Further, dimensions of various elements in the accompanying drawings may be arbitrarily increased or decreased for assisting in a comprehensive understanding.

The terms 'first', 'second', etc. may be used to describe diverse components, but the components are not limited by the terms. The terms may only be used to distinguish one component from the others. For example, without departing from the scope of the present disclosure, a first component may be referred to as a second component, and similarly, a second component may also be referred to as a first component.

Singular expressions of terms include plural expressions of the terms unless the context clearly indicates otherwise. Terms such as "comprises," "having," "including," etc., may indicate the existence of the recited features, numbers, steps, operations, components, parts, or combinations thereof, but do not preclude the existence of one or more other features, numbers, steps, operations, components, parts, or combinations thereof.

Expressions such as "at least one of," when preceding a list of elements, modify the entire list of elements and do not modify the individual elements of the list. For example, the expression, "at least one of a, b, and c," should be understood as including only a, only b, only c, both a and b, both a and c, both b and c, all of a, b, and c, or any variations of the aforementioned examples.

Unless otherwise defined, terms used to describe the embodiments of the disclosure may be interpreted consistently with meanings commonly known to those skilled in the art.

A display module manufactured according to embodiments may include a thin-film transistor (TFT) substrate having a TFT layer formed one surface thereof, a plurality of LEDs arranged on the TFT layer, and a wiring electrically connecting circuits disposed on a rear surface of the substrate. The substrate may correspond to a target substrate, which will be described later, may be any one of a glass substrate, a flexible substrate, and a plastic substrate, and may be referred to as a "backplane."

A display module according to embodiments may include a rear substrate which is electrically connected to the rear surface of the TFT substrate through a flexible printed circuit (FPC). The rear substrate may be provided in a form of a thin film or a form of a thin glass having a thickness of several tens of micrometers ($\mu m$) (e.g., 50 $\mu m$ or less). In the case in which the rear substrate is provided in the form of a thin film, the rear substrate may be formed of a plastic material, for example, any one of polyimide (PI), polyethylene terephthalate (PET), polythersulfone (PES), polyethylene naphtalate (PEN), and polycabonate (PC).

The TFT substrate according to an embodiment may have a side wiring formed on an edge portion, and the side wiring may electrically connect a first connection pad formed on an edge portion of a front surface of the substrate and a second connection pad formed on the rear surface of the substrate. To this end, the side wiring may be formed along the front surface, a side end surface, and the rear surface of the substrate, and may have one end electrically connected to the first connection pad and the other end electrically connected to the second connection pad. Due to the side wiring being partially formed on the side end surface of the substrate, the side wiring may protrude from a side end surface of the TFT substrate by a thickness of the side wiring. In this case, the rear substrate may be electrically connected to the second connection pad through the FPC. A driver integrated circuit (IC) mounted on the rear surface of the TFT substrate may be directly connected to the second connection pad or indirectly connected to the second connection pad through a separate wiring.

In addition, a display module according to an embodiment may be applied to a wearable device, a portable device, a handheld device, and an electronic product or an electronic device having various displays in a single unit, and may be applied to small display devices such as monitors for personal computers and televisions (TVs), and large display devices such as digital signage and electronic displays through a plurality of assembly arrangements.

An LED according to an embodiment may be formed of an inorganic light-emitting material, and may be a semiconductor chip capable of emitting light by itself when power is supplied.

In addition, the LED may have a fast reaction speed, low power, and high luminance, and thus may be a microLED that has been spotlighted as a light-emitting element of a next-generation display. Such a microLED has a higher efficiency of converting electricity to photons than a conventional liquid crystal display (LCD) or organic light-emitting diode (OLED). That is, the microLED has a higher "brightness per watt" than a conventional LCD or OLED display. Accordingly, the micro LED may emit the same brightness while consuming about half the energy of the conventional LED (e.g., an LEG having an area greater than 100 $\mu m \times 100$ $\mu m$) or OLED. In addition, the microLED may implement high resolution, excellent color, contrast, and brightness, thereby accurately expressing a wide range of colors, and implementing a clear screen even in outdoor environments exposed to direct sunlight. In addition, because the microLED is resistant to burn in, and has low heat generation, a long product lifespan is provided without deformation.

In addition, according to an embodiment, when LEDs of different colors (e.g., R, G, and B LEDs) are primarily transferred onto a relay substrate at the same time, and a plurality of LEDs are then secondarily transferred from the relay substrate onto a target substrate for each unit (e.g., each of R, G, and B units), various transferring methods (e.g., a laser transferring method, a stamp transferring method, a roller transferring method, and an electrostatic transferring method) may be applied. Hereinafter, the laser transferring method among the transferring methods described in the disclosure will be described as an example.

The display module according to an embodiment may be applied to a wearable device, a portable device, a handheld device, etc., as a single unit, and to electronic products that have various displays. In addition, the display module may be a matrix type applicable to a display device such as a personal computer monitor, a high-resolution TV, a signage, and an electronic display through a plurality of assembly arrangements.

Hereinafter, a light emitting diode (LED) transfer system 1 according to an embodiment will be described in detail with reference to FIG. 1.

FIG. 1 is a block diagram schematically illustrating an LED transfer system according to an embodiment.

Referring to FIG. 1, a LED transfer system 1 according to an embodiment of the disclosure may include an alignment apparatus 10, a handling robot 20, a transfer stage 30, a substrate stage 40, a laser 50, a memory 60, and a processor 90.

The alignment apparatus 10 may be formed to align a plurality of target substrates 3. The alignment apparatus 10 may be formed to align at least two target substrates 3. The plurality of target substrates 3 may be loaded onto the alignment apparatus 10 from a substrate cassette in which the plurality of target substrates 3 are accommodated. The substrate cassette may be disposed adjacent to the alignment apparatus 10. The target substrate 3 may be loaded onto the alignment apparatus 10 by a substrate loading apparatus.

In the following description, a case in which the alignment apparatus 10 aligns four target substrates 3 will be described. However, the alignment apparatus 10 is not limited thereto. As another example, the alignment apparatus 10 may be formed to align two, three, or five or more target substrates 3.

Hereinafter, the alignment apparatus 10 will be described in detail with reference to FIGS. 2 to 4.

Figure 2:
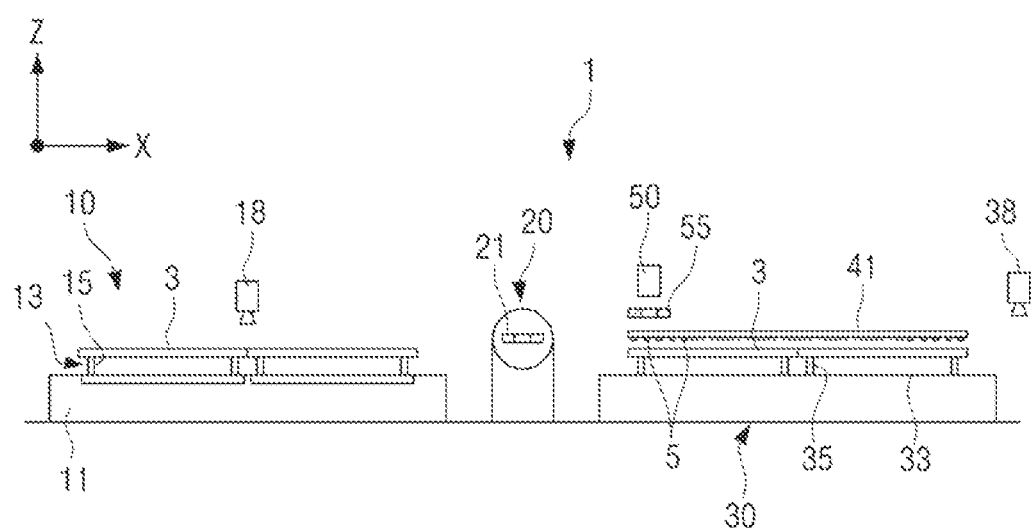
FIG. 2 is a schematic view illustrating an LED transfer system according to an embodiment.

FIG. 2 is a schematic view illustrating an LED transfer system according to an embodiment. FIG. 3 is a plan view illustrating an alignment apparatus according to an embodiment. FIG. 4 is a block diagram illustrating an alignment apparatus according to an embodiment.

Figure 3:
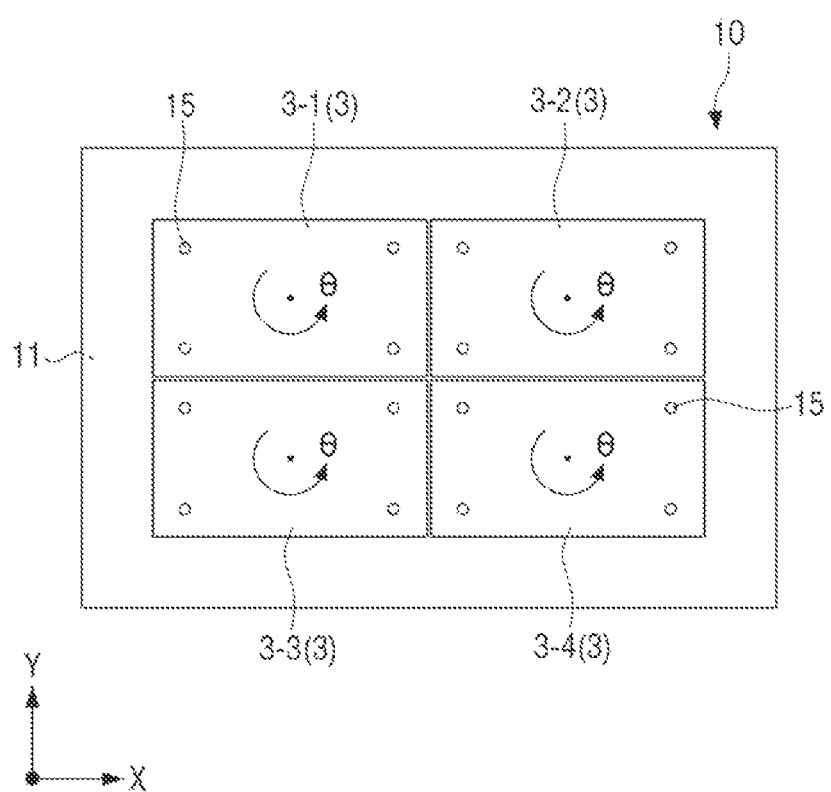
FIG. 3 is a plan view illustrating an alignment apparatus according to an embodiment.
Figure 4:
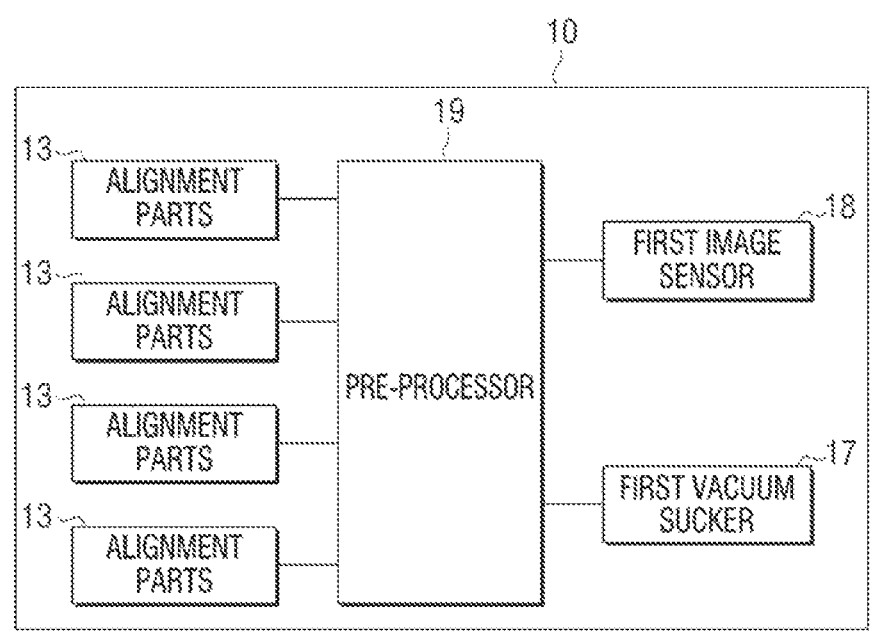
FIG. 4 is a block diagram illustrating an alignment apparatus according to an embodiment.

Referring to FIGS. 2 to 4, the alignment apparatus 10 may include a plurality of alignment supports 13, a first vacuum sucker 17, a first image sensor 18, and a pre-processor 19.

The plurality of alignment supports 13 may be provided to align the plurality of target substrates 3. The plurality of alignment supports 13 may be disposed in the upper side of a base 11 to support and align the plurality of target substrates 3.

In detail, each of the alignment supports 13 may be formed to adjust the target substrate 3 in the X-axis direction (arrow X), Y-axis direction (a direction perpendicular to the drawing), Z-axis direction (arrow Z), and θ direction. Here, the θ direction refers to a direction in which the target substrate 3 rotates in one direction based on the Z-axis direction perpendicular to the center of the target substrate 3.

The plurality of alignment supports 13 may be provided in a number corresponding to the number of the plurality of target substrates 3 which the alignment apparatus 10 may align. In the case of the embodiment shown in FIGS. 2 through 4, the alignment apparatus 10 includes four alignment supports 13 so as to align the four target substrates 3.

Each of the plurality of alignment supports 13 may include a plurality of pins 15 that separate the target substrate 3 from the base 11 by a predetermined distance and also hold the target substrate 3 in a fixed position relative to a corresponding alignment support 13. The plurality of pins 15 may be formed to adsorb and fix the target substrate 3 by vacuum suction. To this end, the alignment apparatus 10 may include the first vacuum sucker 17 capable of generating a suction force at the tips of the plurality of pins 15.

A suction passage may be provided in each of the plurality of pins 15, and an inlet of the suction passage may be provided at the tip of the pin 15. The suction passages of the plurality of pins 15 are in communication with the first vacuum sucker 17. Accordingly, when the first vacuum sucker 17 is operated, a vacuum is generated in the suction passages of the plurality of pins 15 so that the target substrate 3 is sucked and fixed by the plurality of pins 15.

The alignment apparatus 10 may include the first image sensor 18 to align the plurality of target substrates 3. The first image sensor 18 may be configured to detect the relative positions of the plurality of target substrates 3. For example, the first image sensor 18 may be configured to measure a distance between pluralities of connection terminals 3a (see FIG. 5) provided on the upper surface of the target substrate 3. A plurality of light emitting diodes (LEDs) may be transferred and attached to the plurality of connection terminals 3a of the target substrate 3.

The pre-processor 19 may control the plurality of alignment supports 13 and the first image sensor 18 to align the plurality of target substrates 3. Here, alignment of the plurality of target substrates 3 refers to adjust the positions of the plurality of target substrates 3 so that the distance between two adjacent connection terminals 3a of two adjacent target substrates 3 is the same as the distance between two adjacent connection terminals 3a of one target substrate 3. The pre-processor 19 may be configured as a part of the processor 90 to be described later.

Hereinafter, a method in which the alignment apparatus 10 aligns the plurality of target substrates 3 will be described in detail with reference to FIG. 5.

Figure 5:
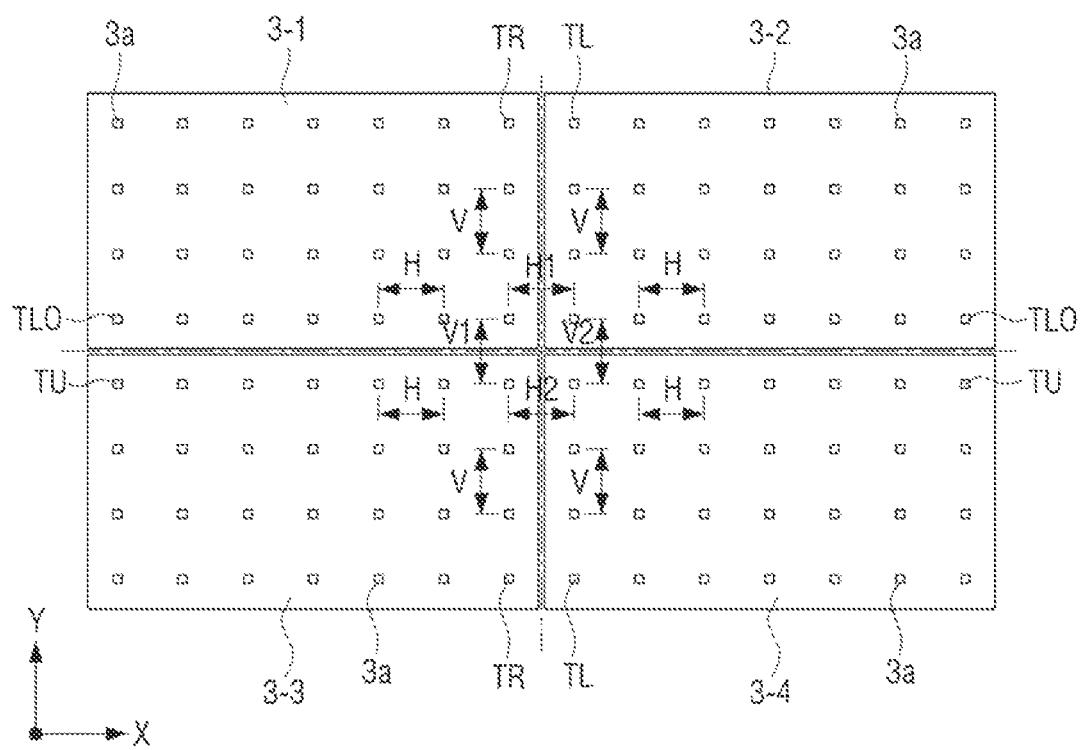
FIG. 5 is a view illustrating a state in which four target substrates are aligned by an alignment apparatus according to an embodiment.

FIG. 5 is a diagram showing a state in which four target substrates are aligned by a alignment apparatus according to an embodiment.

The pre-processor 19 controls the first image sensor 18 to measure the horizontal distance H and the vertical distance V between the plurality of connection terminals 3a provided on the target substrate 3. Here, the horizontal distance H of the target substrate 3 refers to a distance between two connection terminals 3a adjacent in the horizontal direction among the plurality of connection terminals 3a of the target substrate 3. In addition, the vertical distance V of the target substrate 3 refers to a distance between two connection terminals 3a adjacent in the vertical direction among the plurality of connection terminals 3a of the target substrate 3. Because the four target substrates 3 are formed in the same standard, the horizontal distances H and the vertical distances V of the four target substrates 3 are the same.

On the other hand, the pre-processor 19 may control the first image sensor 18 to measure the distance between the two connection terminals 3a located at the outermost sides of the two adjacent target substrates 3. For example, in FIG. 5, the pre-processor 19 may measure the horizontal distance H1 between the connection terminal 3a of the first target substrate 3-1 and the connection terminal 3a of the second target substrate 3-2, which are adjacent to each other in the horizontal direction, by using the first image sensor 18. In detail, the first image sensor 18 may measure the horizontal distance H1 between the connection terminal 3a located at the rightmost side of the first target substrate 3-1 (that is, a rightmost connection terminal, TR) and the connection terminal 3a located at the leftmost side of the second target substrate 3-2 (that is, a leftmost connection terminal, TL).

When the horizontal distance H1 between the rightmost connection terminal TR of the first target substrate 3-1 and the leftmost connection terminal TL of the second target substrate 3-2 is not the same as the horizontal distance H of the target substrate 3, the pre-processor 19 controls the alignment supports 13 to move the first target substrate 3-1 and the second target substrate 3-2 so that the horizontal distance H1 between the rightmost connection terminal TR of the first target substrate 3-1 and the leftmost connection terminal TL of the second target substrate 3-2 is equal to the horizontal distance H of the target substrate 3. Because the alignment supports 13 may move each of the first and second target substrates 3-1 and 3-2 in the X-axis direction, the Y-axis direction, and the θ direction, the alignment supports 13 may adjust the horizontal distance H1 between the rightmost connection terminal TR of the first target substrate 3-1 and the leftmost connection terminal TL of the second target substrate 3-2.

In addition, the pre-processor 19 may control the first image sensor 18 to measure the vertical distance V1 between the connection terminal 3a of the first target substrate 3-1 and the connection terminal 3a of the third target substrate 3-3 which are adjacent to each other in the vertical direction. In detail, the first image sensor 18 may measure the vertical distance V1 between the connection terminal 3a located at the lowermost side of the first target substrate 3-1 (that is, a lowermost connection terminal, TLO) and the connection terminal 3a located at the uppermost side of the third target substrate 3-3 (that is, a uppermost connection terminal, TU).

When the vertical distance V1 between the lowermost connection terminal TLO of the first target substrate 3-1 and the uppermost connection terminal TU of the third target substrate 3-3 is not the same as the vertical distance V of the target substrate 3, the pre-processor 19 controls the alignment supports 13 to move the first target substrate 3-1 and the third target substrate 3-3 so that the vertical distance V1 between the lowermost connection terminal TLO of the first target substrate 3-1 and the uppermost connection terminal TU of the third target substrate 3-3 is made equal to the vertical distance V of the target substrate 3. Because the alignment supports 13 may move each of the first target substrate 3-1 and the third target substrate 3-3 in the X-axis direction, the Y-axis direction, and the θ direction, the alignment supports 13 may adjust the vertical distance V1 between the lowermost connection terminal TLO of the first target substrate 3-1 and the uppermost connection terminal TU of the third target substrate 3-3.

In addition, the pre-processor 19 may control the first image sensor 18 and the alignment supports 13, similarly to the above, so that the vertical distance V2 between the lowermost connection terminal TLO of the second target substrate 3-2 and the uppermost connection terminal TU of the fourth target substrate 3-4 and the horizontal distance H2 between the rightmost connection terminal TR of the third target substrate 3-3 and the leftmost connection terminal TL of the fourth target substrate 3-4 are made equal to the vertical distance V and the horizontal distance H of the target substrate 3.

The handling robot 20 may carry the plurality of target substrates 3 while maintaining an aligned state of the plurality of target substrates 3 aligned in the alignment apparatus 10. In other words, the handling robot 20 may transport the plurality of target substrates 3 aligned in the alignment apparatus 10 to the transfer stage 30 at one time (that is, at the same time) while maintaining the horizontal distance H and the vertical distance V of the plurality of target substrates 3. Accordingly, the plurality of target substrates 3 transported to the transfer stage 30 by the handling robot 20 may maintain the aligned state.

To this end, the handling robot 20 may include a gripper 21 formed to transport the plurality of target substrates 3. In the case of this embodiment, because the alignment apparatus 10 aligns four target substrates 3, the gripper 21 may be formed to transport the four target substrates 3 at the same time while maintaining the aligned state.

Hereinafter, a gripper used in a handling robot according to an embodiment of the disclosure will be described in detail with reference to FIGS. 6 and 7.

Figure 6:
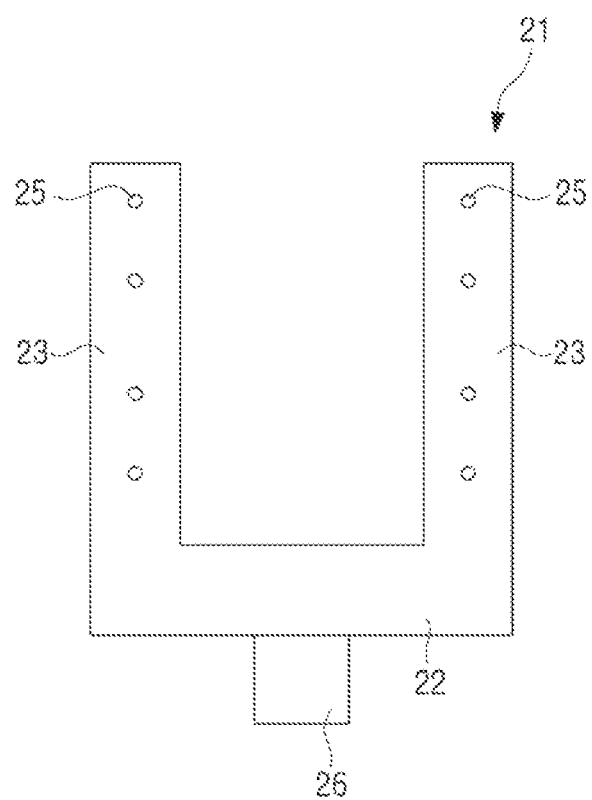
FIG. 6 is a view illustrating a gripper of a handling robot used in a LED transfer system according to an embodiment.
Figure 7:
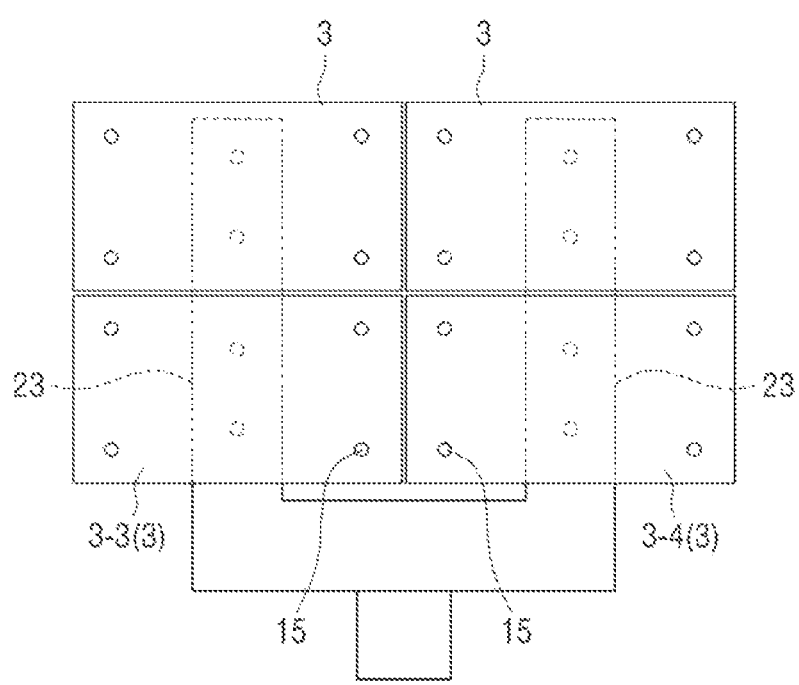
FIG. 7 is a view illustrating a state in which a gripper of a handling robot according to an embodiment adsorbs a plurality of target substrates of an alignment apparatus.

FIG. 6 is a view illustrating a gripper of a handling robot used in a LED transfer system according to an embodiment. FIG. 7 is a view illustrating a state in which a gripper of a handling robot according to an embodiment adsorbs a plurality of target substrates of a alignment apparatus.

The gripper 21 may be formed so as not to interfere with the plurality of pins 15 protruding from the base 11 of the alignment apparatus 10 and supporting the plurality of target substrates 3. Referring to FIG. 6, the gripper 21 of the handling robot 20 according to an embodiment may be provided in a U-shape with a substantially flat bottom.

For example, the gripper 21 may include a central portion 22 and a pair of extension portions 23 extending substantially vertically from both ends of the central portion 22. The pair of extension portions 23 may be disposed in the central portion 22 parallel to each other. The length of each of the extension portions 23 may be determined to stably support the two target substrates 3 as illustrated in FIG. 7.

In addition, the spacing between the pair of extension portions 23 of the gripper 21 may be determined so that the pair of extension portions 23 do not interfere with the plurality of pins 15 of the alignment apparatus 10 supporting the plurality of target substrates 3. For example, as illustrated in FIG. 7, the pair of extension portions 23 may be spaced apart from each other by a predetermined distance so that the pair of extension portions 23 respectively support the third target substrate 3-3 and the fourth target substrate 3-4 adjacent to each other and do not interfere with the two pins 15 adjacent to each other. Accordingly, when the handling robot 20 positions the gripper 21 under the plurality of target substrates 3, the gripper 21 may not interfere with the plurality of pins 15 of the alignment apparatus 10 and may support the plurality of target substrates 3.

In addition, the pair of extension portions 23 of the gripper 21 may have a thickness thinner than the spacing between the upper surface of the base 11 of the alignment apparatus 10 and the plurality of target substrates 3. In other words, the thickness of the extension portion 23 may be smaller than the length of each of the plurality of pins 15 protruding from the upper surface of the alignment apparatus 10.

In addition, the gripper 21 may adsorb and fix the plurality of target substrates 3 by vacuum suction. To this end, a plurality of suction ports 25 may be provided on the upper surface of each of the pair of extension portions 23. The plurality of suction ports 25 may be in communication with a suction passage provided in each of the extension portions 23.

The suction passage may be connected to a second vacuum sucker. The second vacuum sucker may be provided in the gripper 21 or the handling robot 20. Therefore, when the second vacuum sucker is operated, a suction force is generated in each of the plurality of suction ports 25 so that the plurality of target substrates 3 may be sucked onto the upper surface of the gripper 21.

A coupling part 26 to be coupled to the handling robot 20 may be provided in the center of one side surface of the central portion 22. Accordingly, the gripper 21 is coupled to the handling robot 20 and may be moved between the alignment apparatus 10 and the transfer stage 30.

In the above-described embodiment, the gripper 21 is formed to fix the plurality of target substrates 3 using a vacuum suction force; however, the gripper 21 is not limited thereto. The gripper 21 may have various structures as long as it can transport the plurality of target substrates 3 from the alignment apparatus 10 to the transfer stage 30 while maintaining the alignment of the plurality of target substrates 3.

The handling robot 20 may move the gripper 21 as described above between the alignment apparatus 10 and the transfer stage 30. Various types of handling robots according to the prior art such as a Cartesian coordinate robot, an articulated robot, or the like may be used as the handling robot 20; therefore, a detailed description thereof is omitted.

The transfer stage 30 may clamp the plurality of target substrates 3 transported by the handling robot 20. Further, the transfer stage 30 may move the plurality of target substrates 3 in the X-axis direction and the Y-axis direction with respect to the laser 50. If necessary, the transfer stage 30 may be formed to move the plurality of target substrates 3 in the Z-axis direction.

Hereinafter; the transfer stage 30 may be described in detail with reference to FIGS. 2 and 8.

Figure 8:
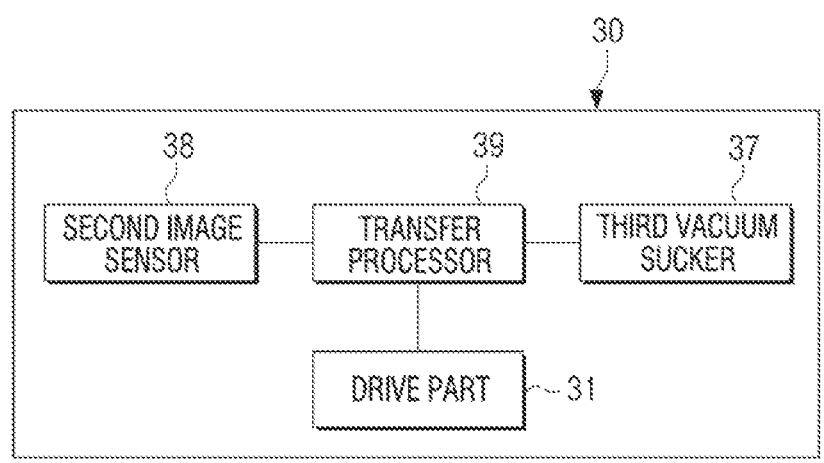
FIG. 8 is a block diagram illustrating a transfer stage according to an embodiment.

FIG. 8 is a block diagram showing a transfer stage according to an embodiment.

Referring to FIG. 2, the transfer stage 30 may include a transfer base 33 and a plurality of fixing pins 35.

The transfer base 33 may be formed to move in the X-axis direction and the Y-axis direction. Accordingly, the transfer stage 30 may include a drive part 31 that enables the transfer base 33 to move in the X-axis direction and the Y-axis direction.

The plurality of fixing pins 35 may be provided on the upper surface of the transfer base 33. In other words, the plurality of fixing pins 35 protrude from the upper surface of the transfer base 33 and may be formed to fix the plurality of target substrates 3 transported by the handling robot 20. The plurality of fixing pins 35 may be formed to adsorb and fix the plurality of target substrates 3 by vacuum suction. To this end, the transfer stage 30 may include a third vacuum sucker 37 capable of generating a vacuum.

A suction passage may be provided in each of the plurality of fixing pins 35, and an inlet of the suction passage may be provided at the tip of each of the plurality of fixing pins 35. The suction passages of the plurality of fixing pins 35 may be in communication with the third vacuum sucker 37. Accordingly, when the third vacuum sucker 37 is operated, vacuum may be generated in the suction passages of the plurality of fixing pins 35 so that the target substrate 3 is sucked by the plurality of fixing pins 35. Accordingly, the target substrate 3 may be supported and fixed by the plurality of fixing pins 35.

The transfer stage 30 may include a second image sensor 38 to align the plurality of target substrates 3 fixed by the plurality of fixing pins 35 with respect to the laser apparatus 50 and a relay substrate 41.

A transfer processor 39 may control the third vacuum sucker 37 so that the plurality of target substrates 3 are adsorbed onto the plurality of fixing pins 35, and may control the drive part 31 to move the transfer stage 30 in the X-axis direction and the Y-axis direction. In addition, the transfer processor 39 may control the second image sensor 38 and the drive part 31 so that the plurality of target substrates 3 are aligned with the laser 50. The transfer processor 39 may be configured as a part of the processor 90 to be described later.

The substrate stage 40 may support the relay substrate 41 so as to face the plurality of target substrates 3 fixed to the transfer stage 30 and to move the relay substrate 41 with respect to the transfer stage 30. For example, the substrate stage 40 may be formed to move the relay substrate 41 in the X-axis direction, Y-axis direction, and Z-axis direction, and to rotate the relay substrate 41 based on the Z-axis.

The relay substrate 41 may include a plurality of light emitting diodes (LEDs) 5 to be transferred onto the plurality of target substrates 3. The relay substrate 41 may include a red LED relay substrate including only a plurality of red LEDs, a green LED relay substrate including only a plurality of green LEDs, and a blue LED relay substrate including only a plurality of blue LEDs. In addition, the relay substrate 41 may include a transfer wafer manufactured in a state in which a plurality of LEDs 5 may be transferred onto the target substrate 3.

Accordingly, the substrate stage 40 may sequentially move the red LED relay substrate 41, the green LED relay substrate 41, and the blue LED relay substrate 41 to a position facing the transfer stage 30.

The plurality of LEDs 5 may be formed by epitaxial growth on a growth substrate for each light emission color R, G, B. In detail, the red growth substrate may be a substrate in which only red LEDs are grown through the epitaxial process, the green growth substrate may be a substrate in which only green LEDs are grown, and the blue growth substrate may be a substrate in which only blue LEDs are grown.

The red, green, and blue growth substrates may all be transparent substrates made of sapphire, silicon, or transparent glass to be used in a transfer process to which a laser lift off (LLO) method is applied. In this case, the transparent glass may be made of a material that may be applied to epitaxial growth for forming a chip stack, such as metal organic chemical vapor deposition (MOCVD) or molecular beam epitaxy (MBE).

In addition, each of the growth substrates may include a buffer layer formed of a material capable of alleviating strain caused by a difference in lattice constant and coefficient of thermal expansion between a GaN layer and the growth substrate on an upper surface thereof.

The buffer layer may be formed of GaN, AlN, AlGaN, or SiNx, which are high heat resistance materials, to enable GaN layer deposition through a MOCVD or MBE process.

The relay substrate 41 may be formed larger than the size of the growth substrate. Accordingly, not only a plurality of LEDs disposed on one growth substrate, but also a plurality of LEDs disposed on a plurality of growth substrates may be transferred onto one relay substrate 41 by a laser lift-off method.

The plurality of LEDs transported from the growth substrate to the relay substrate 41 may be attached to an adhesive layer formed on the relay substrate 41. The adhesive layer may be referred to as a dynamic release layer (DRL), and may be formed of a polyimide (PI) material to facilitate separation during transfer to the target substrate 3 by the laser lift-off method.

The relay substrate 41 may be a transparent substrate made of sapphire, silicon, or transparent glass, and may be used in a process to which the laser lift-off method is applied.

A predetermined number of LEDs 5 among the plurality of LEDs 5 transported to the relay substrate 41 may be simultaneously transferred onto the target substrate 3 by the laser lift-off method.

The laser 50 may emit a laser beam toward the plurality of LEDs 5 of the relay substrate 41 mounted on the substrate stage 40. When a laser beam is emitted from the laser apparatus 50, the plurality of LEDs 5 of the relay substrate 41 may be transferred onto the target substrates 3.

The processor 90 may be electrically connected to the alignment apparatus 10, the handling robot 20, the transfer stage 30, the substrate stage 40, and the laser apparatus 50, and may be configured to control them to transfer the plurality of LEDs 5 of the relay substrate 41 onto the target substrates 3.

In detail, the processor 90 may control the alignment apparatus 10 so that the alignment apparatus 10 aligns the plurality of target substrates 3. In this case, the processor 90 may be formed to exchange signals and data with the pre-processor 19 of the alignment apparatus 10. As another example, the alignment apparatus 10 may not include the pre-processor 19 and the processor 90 may directly control the alignment apparatus 10.

The processor 90 may control the handling robot 20 to transport the plurality of target substrates 3 aligned by the alignment apparatus 10 to the transfer stage 30.

The processor 90 may control the transfer stage 30 to fix the plurality of target substrates 3 transported by the handling robot 20 onto the plurality of fixing pins 35. In other words, the processor 90 may operate the third vacuum sucker 37 of the transfer stage 30 so that the plurality of target substrates 3 are adsorbed to the plurality of fixing pins 35.

After that, the processor 90 may control the transfer stage 30, the substrate stage 40, and the laser apparatus 50 to transfer the plurality of LEDs 5 of the relay substrate 41 onto the target substrates 3.

The processor 90 may be connected to the memory 60. The memory 60 may be implemented by at least one of a flash memory type, a read-only memory (ROM), a random access memory (RAM), a hard disk type, a multimedia card micro type, or a card type memory (e.g., a secure digital (SD) or extreme digital (XD) memory).

In addition, the memory 60 may be electrically connected to the processor 90 to transmit and receive signals and information to and from the processor 90. Accordingly, the memory 60 may store input information about the target substrates 3 and the relay substrate 41, and may transmit the stored information to the processor 90.

On the other hand, the processor 90 may include one or more of a central processing unit (CPU), a controller, an application processor (AP), a communication processor (CP), or an ARM processor.

Accordingly, the transfer stage 30, the substrate stage 40, the laser 50, and the processor 90 may constitute a light emitting diode (LED) transfer apparatus.

Hereinafter, a process of transferring the plurality of LEDs 5 from the relay substrate 41 to the plurality of target substrates 3 will be described with reference to FIGS. 1 and 2.

The target substrate 3 may include a thin film transistor (TFT) layer formed on the front surface thereof and a wiring electrically connecting the plurality of LEDs disposed on the TFT layer and a circuit disposed on the rear surface of the target substrate 3.

The target substrate 3 configured as described above may undergo a process in which the plurality of LEDs emitting different color lights are sequentially transferred onto the TFT layer. The target substrate 3 that has undergone such a transfer process may be referred to as a display module.

In other words, a plurality of red LEDs are transferred from the red LED relay substrate 41 onto the target substrate 3, and then a plurality of green LEDs are transferred from the green LED relay substrate 41 onto the target substrate 3, and finally a plurality of blue LEDs are transferred from the blue LED relay substrate 41 onto the target substrate 3, thereby forming the display module.

The transfer process in which the laser lift-off method is performed is described as an example, but the transfer process is not limited thereto. Alternatively, the transfer process may be performed through a pick-and-place method (or a stamp method).

Referring to FIG. 2, the plurality of target substrates 3 are fixed to the transfer stage 30 in a state in which surfaces of the target substrates 3 to which the plurality of LEDs 5, that is, the plurality of red, green, and blue LEDs are transferred face the laser apparatus 50. At this time, the plurality of target substrates 3 are sucked by the plurality of fixing pins 35 of the transfer stage 30 so as to maintain the alignment by the alignment apparatus 10.

The relay substrate 41 is disposed so that the plurality of LEDs 5 face the target substrates 3. The relay substrate 41 may be fixed to the substrate stage 40. The substrate stage 40 may move the relay substrate 41 to a desired point along the X-Y plane as the substrate stage 40 moves in the X-axis direction and the Y-axis direction.

A mask 55 may be disposed above the relay substrate 41 and may be fixed together with the laser 50. The mask 55 may be formed so that the irradiation area of the laser beam emitted from the laser apparatus 50 is limited to a desired point.

In order to simultaneously transfer the plurality of LEDs 5 from the relay substrate 41 to the target substrates 3, the relay substrate 41 and the plurality of target substrates 3 may respectively be set an initial position by the substrate stage 40 and the transfer stage 30. The initial position may be a start point at which a predetermined number of LEDs 5 are transferred from the first row of the relay substrate 41 to the target substrate 3 by the laser beam.

The laser 50 may emit a laser beam to a predetermined point on the relay substrate 41. Then, the plurality of predetermined LEDs 5 in the first row arranged on the relay substrate 41 may be separated from the adhesive layer of the relay substrate 41 and transferred to the target substrate 3.

Until the LEDs 5 are transferred to all the connection terminals 3a of the plurality of target substrates 3, the processor 90 may control the laser apparatus 50 to emit the laser beam to the relay substrate 41 while moving the transfer stage 30 and the substrate stage 40, so that the plurality of LEDs 5 are transferred to the plurality of target substrates 3.

Hereinafter, a method of moving the plurality of target substrates 3 by the transfer stage 30 will be described in detail with reference to FIG. 9.

Figure 9:
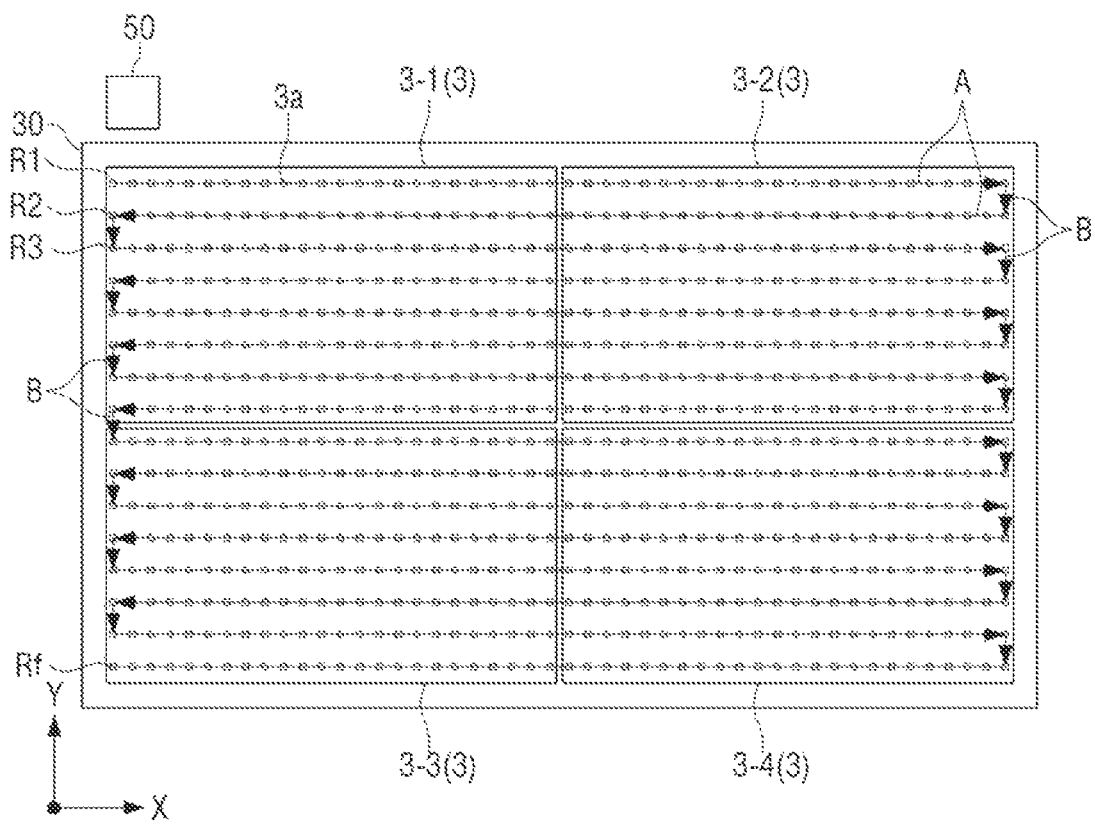
FIG. 9 is a view illustrating a path through which an LED transfer system according to an embodiment transfers a plurality of LEDs.

FIG. 9 is a diagram showing a path through which an LED transfer system transfers a plurality of LEDs according to an embodiment.

As shown in FIG. 9, four target substrates 3-1, 3-2, 3-3, and 3-4 are fixed to the upper portion of the transfer stage 30 by the plurality of fixing pins 35 (see FIG. 2). Although not illustrated, the relay substrate 41 including the plurality of LEDs 5 is provided above the plurality of target substrates 3. The relay substrate 41 may be moved separately from the plurality of target substrates 3 by the substrate stage 40.

The processor 90 may control the transfer stage 30 so that the leftmost connection terminal 3a of the first row R1 of the first target substrate 3-1 is located under the laser 50 (initial position). In addition, the processor 90 may control the substrate stage 40 so that the relay substrate 41 on which the plurality of LEDs 5 to be transferred to the first target substrate 3-1 are attached is placed under the laser apparatus 50 above the first target substrate 3-1. In other words, the processor 90 allows the relay substrate 41 to be positioned between the laser apparatus 50 and the first target substrate 3-1. In this state, the processor 90 operates the laser apparatus 50 to emit a laser beam. Then, the number of LEDs 5 corresponding to the size of the laser beam is transferred from the relay substrate 41 to the first row R1 of the first target substrate 3-1.

Subsequently, the processor 90 may control the transfer stage 30 so that the plurality of target substrates 3 are moved a predetermined distance in the negative X-axis direction, so that some of connection terminals 3a of the first row R1 of the first target substrate 3-1 on which the LEDs 5 are not transferred is positioned under the laser apparatus 50. Here, the negative X-axis direction refers to the opposite direction to the X-axis direction.

In addition, the processor 90 may control the substrate stage 40 so that a portion of the relay substrate 41 to which the plurality of LEDs 5 are attached is positioned under the laser apparatus 50. After that, the processor 90 operates the laser apparatus 50 to emit a laser beam. Then, the number of LEDs 5 corresponding to the size of the laser beam is transferred from the relay substrate 41 to the first row R1 of the first target substrate 3-1.

Until the LEDs 5 are transferred to all the connection terminals 3a of the first rows R1 of the first and second target substrates 3-1 and 3-2, as described above, the processor 90 controls the transfer stage 30 to move the plurality of target substrates 3 in the negative X-axis direction, controls the substrate stage 40 to move the relay substrate 41 to correspond to the target substrates 3, and controls the laser apparatus 50 to irradiate the laser beam, thereby transferring the LEDs 5 to the first and second target substrates 3-1 and 3-2. In this case, the horizontal distance H1 between the rightmost connection terminal 3a of the first row R1 of the first target substrate 3-1 and the leftmost connection terminal 3a of the first row R1 of the second target substrate 3-2 is the same as the horizontal distance H between two adjacent connection terminals 3a of the first target substrate 3-1 or the second target substrate 3-2, so that the LEDs 5 may be simultaneously transferred to the rightmost connection terminal 3a of the first row R1 of the first target substrate 3-1 and the leftmost connection terminal 3a of the first row R1 of the second target substrate 3-2.

When the LEDs 5 are transferred to all the connection terminals 3a of the first rows R1 of the first and second target substrates 3-1 and 3-2, the processor 90 controls the transfer stage 30 so that the plurality of target substrates 3 are moved in the Y-axis direction (upward direction) perpendicular to the X-axis, so that the rightmost connection terminal 3a of the second row R2 of the second target substrate 3-2 is positioned under the laser apparatus 50. In addition, the processor 90 may control the substrate stage 40 so that a portion of the relay substrate 41 to which the plurality of LEDs 5 to be transferred to the second target substrate 3-2 are attached is positioned under the laser apparatus 50. In this state, the processor 90 operates the laser apparatus 50 to emit a laser beam. Then, the number of LEDs 5 corresponding to the size of the laser beam is transferred from the relay substrate 41 to the second row R2 of the second target substrate 3-2.

Subsequently, the processor 90 may control the transfer stage 30 so that the plurality of target substrates 3 are moved in the X-axis direction (right direction), so that some of the connection terminals 3a of the second row R2 of the second target substrate 3-2 onto which the LEDs 5 are not transferred is positioned under the laser apparatus 50. In addition, the processor 90 may control the substrate stage 40 so that a portion of the relay substrate 41 to which the plurality of LEDs 5 are attached is positioned under the laser apparatus 50. After that, the processor 90 may operate the laser 50 to irradiate a laser beam. Then, the number of LEDs 5 corresponding to the size of the laser beam is transferred from the relay substrate 41 to the second row R2 of the second target substrate 3-2.

Until the LEDs 5 are transferred to all the connection terminals 3a of the second rows R2 of the first and second target substrates 3-1 and 3-2, as described above, the processor 90 may control the transfer stage 30 to move the plurality of target substrates 3 in the X-axis direction, control the substrate stage 40 to move the relay substrate 41 to correspond to the target substrates 3, and control the laser apparatus 50 to irradiate the laser beam, so that the LEDs 5 are transferred onto the first and second target substrates 3-1 and 3-2.

When the LEDs 5 are transferred to all the connection terminals 3a of the second rows R2 of the first and second target substrates 3-1 and 3-2, the processor 90 may control the transfer stage 30 so that the plurality of target substrates 3 are moved in the Y-axis direction (upward direction), so that the leftmost connection terminal 3a of the third row R3 of the first target substrate 3-1 is positioned under the laser apparatus 50. In addition, the processor 90 may control the substrate stage 40 so that a portion of the relay substrate 41 to which the plurality of LEDs 5 to be transferred to the first target substrate 3-1 are attached is positioned under the laser 50. In this state, the processor 90 operates the laser apparatus 50 to irradiate a laser beam. Then, the number of LEDs 5 corresponding to the size of the laser beam is transferred from the relay substrate 41 to the third row R3 of the first target substrate 3-1.

The processor 90 may control the transfer stage 30 to move the plurality of target substrates 3, controls the substrate stage 40 to move the relay substrate 41, and operates the laser apparatus 50 to irradiate the laser beam as described above until the LEDs 5 are transferred to all the connection terminals 3a of the last rows Rf of the third target substrate 3-3 and the fourth target substrate 3-4.

In FIG. 9, arrows A and B in the horizontal and vertical directions, respectively, indicate the direction in which the LEDs 5 are transferred. In detail, the LEDs 5 are sequentially transferred from the left to the right of the first row R1, that is, in the X-axis direction, and when the transfer of the LEDs 5 to the first row R1 is completed, the LEDs 5 are transferred to the second row R2. The LEDs 5 are sequentially transferred from the right to the left of the second row R2, that is, in the negative X-axis direction. In the last row Rf, the LEDs 5 are transferred from the right to the left. To this end, as described above, the target substrates 3 are moved in the opposite direction to the arrow direction of FIG. 9.

In other words, in the LED transfer system 1 according to an embodiment, the LEDs 5 may be transferred in zigzag to the entire plurality of target substrates 3. In other words, the processor 90 controls the transfer stage 30 so that the plurality of target substrates 3 are moved along a zigzag path with respect to the laser apparatus 50. In this case, the moving length of the zigzag path in the X-axis direction (the moving length in the direction of arrow A in FIG. 9) corresponds to the length in the X-axis direction of at least two target substrates 3 aligned in the X-axis direction among the plurality of target substrates 3, and the moving length of the zigzag path in the Y-axis direction (the moving length in the direction of arrow B in FIG. 9) corresponds to the vertical distance V of the connection terminals 3a of the plurality of target substrates 3.

Figure 10:
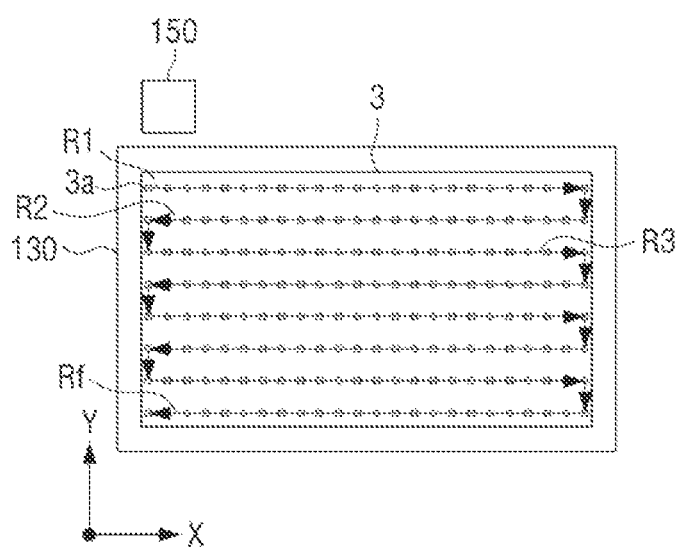
FIG. 10 is a view illustrating a path through which an LED transfer system according to the prior art transfers a plurality of LEDs.

Accordingly, the LED transfer system 1 according to an embodiment may reduce the transfer time compared to the process of transferring the LEDs by the LED transfer system according to the prior art as shown in FIG. 10 to be described later.

FIG. 10 is a diagram showing a path through which an LED transfer system according to a prior art transfers a plurality of LEDs.

As shown in FIG. 10, one target substrate 3 is fixed to the upper portion of a transfer stage 130. Although not illustrated, a relay substrate including a plurality of LEDs is provided above the target substrate 3. The relay substrate may be moved separately from the target substrate 3 by a substrate stage.

A processor controls the transfer stage 130 so that the leftmost connection terminal 3a of the first row R1 of the target substrate 3 is positioned under the laser apparatus 150 (initial position). In addition, the processor controls the substrate stage so that the relay substrate to which the plurality of LEDs to be transferred to the target substrate 3 are attached is positioned under the laser apparatus 150 above the target substrate 3. In this state, the processor operates the laser apparatus 150 to emit a laser beam. Then, the number of LEDs corresponding to the size of the laser beam is transferred from the relay substrate to the first row R1 of the target substrate 3.

Subsequently, the processor controls the transfer stage 130 so that the target substrate 3 is moved a predetermined distance in the negative X-axis direction (left direction), so that some of connection terminals of the first row R1 of the target substrate 3 onto which the LEDs are not transferred is positioned under the laser apparatus 150. In addition, the processor controls the substrate stage so that a portion of the relay substrate to which the plurality of LEDs are attached is positioned under the laser apparatus 150. After that, the processor operates the laser apparatus 150 to emit a laser beam. Then, the number of LEDs corresponding to the size of the laser beam is transferred from the relay substrate to the first row R1 of the target substrate 3.

Until the LEDs are transferred to all the connection terminals of the first row R1 of the target substrate 3, as described above, the processor controls the transfer stage 130 to move the target substrate 3 in the negative X-axis direction, controls the substrate stage to move the relay substrate to correspond to the target substrate 3, and controls the laser apparatus 150 to irradiate the laser beam, thereby transferring the LEDs to the target substrate 3.

When the LEDs are transferred to all the connection terminals of the first row R1 of the target substrate 3, the processor controls the transfer stage 130 so that the target substrate 3 is moved in the Y-axis direction (upward direction), so that the rightmost connection terminal of the second row R2 of the target substrate 3 is positioned under the laser apparatus 150. In addition, the processor controls the substrate stage so that a portion of the relay substrate to which the plurality of LEDs to be transferred to the target substrate 3 are attached is positioned under the laser apparatus 150. In this state, the processor operates the laser apparatus 150 to irradiate a laser beam. Then, the number of LEDs corresponding to the size of the laser beam is transferred from the relay substrate to the second row R2 of the target substrate 3.

Subsequently, the processor controls the transfer stage 130 so that the target substrate 3 is moved by a predetermined distance in the X-axis direction (right direction), so that some of the connection terminals of the second row R2 of the target substrate 3 onto which the LEDs are not transferred is positioned under the laser apparatus 150. In addition, the processor controls the substrate stage so that a portion of the relay substrate to which the plurality of LEDs are attached is positioned under the laser apparatus 150. After that, the processor operates the laser apparatus 150 to emit a laser beam. Then, the number of LEDs corresponding to the size of the laser beam is transferred from the relay substrate to the second row R2 of the target substrate 3.

Until the LEDs are transferred to all the connection terminals of the second row R2 of the target substrate 3, as described above, the processor controls the transfer stage 130 to move the target substrate 3 in the X-axis direction, controls the substrate stage to move the relay substrate to correspond to the target substrate 3, and controls the laser apparatus 150 to irradiate the laser beam, so that the LEDs are transferred onto the target substrate 3.

When the LEDs are transferred to all the connection terminals of the second row R2 of the target substrate 3, the processor controls the transfer stage 130 so that the target substrate 3 is moved in the Y-axis direction (upward direction), so that the leftmost connection terminal of the third row R3 of the target substrate 3 is positioned under the laser apparatus 150. In addition, the processor controls the substrate stage so that a portion of the relay substrate to which the plurality of LEDs to be transferred to the target substrate 3 are attached is positioned under the laser apparatus 150. In this state, the processor operates the laser apparatus 150 to irradiate a laser beam. Then, the number of LEDs corresponding to the size of the laser beam is transferred from the relay substrate to the third row R3 of the target substrate 3.

The processor controls the transfer stage 130 to move the target substrate 3, controls the substrate stage to move the relay substrate, and controls the laser apparatus 150 to irradiate the laser beam as described above, until the LEDs are transferred to all the connection terminals of the last row Rf of the target substrate 3.

In FIG. 10, arrows in the horizontal and vertical directions indicate the direction in which the LEDs are transferred. In detail, the LEDs are sequentially transferred from the left to the right of the first row R1, and when the transfer of the LEDs to the first row R1 is completed, the LEDs are transferred to the second row R2. The LEDs are sequentially transferred from the right to the left of the second row R2. In the last row Rf, the LEDs are transferred from the right to the left. To this end, as described above, the target substrate 3 is moved in the opposite direction to the arrow direction of FIG. 10.

In other words, in the LED transfer system according to the prior art, the LEDs may be transferred to one target substrate 3 in a zigzag manner. Therefore, in the case of transferring the LEDs to the plurality of target substrates 3 by the LED transfer system according to the prior art, the number of times the transfer stage 130 moves the target substrates 3 in the Y-axis direction is more than that of the LED transfer system 1 according to an embodiment of the disclosure.

For example, as shown in FIG. 9, when the LED transfer system 1 according to an embodiment of the disclosure transfers the LEDs to the four target substrates 3, the transfer stage 30 moves the four target substrates 3 in the Y-axis direction fifteen (15) times.

However, as shown in FIG. 10, in order to transfer the LEDs to the four target substrates 3 using the LED transfer system according to the prior art, it is necessary to repeat the process of transferring the LEDs to one target substrate 3 at a time four (4) times. The number of times the LED transfer system according to the prior art moves the target substrate 3 in the Y-axis direction to transfer the LEDs to one target substrate 3 is seven (7) times. Therefore, the number of times the target substrates 3 are moved in the Y-axis direction to transfer the LEDs to four target substrates 3 is 28 times (7×4=28).

Accordingly, the LED transfer system 1 according to an embodiment may transfer the LEDs to a plurality of target substrates 3 mounted on the transfer stage 30, so that the transfer time may be reduced compared to the LED transfer system according to the prior art configured to transfer the LEDs to one target substrate 3 mounted on the transfer stage 130.

In the above description, when the target substrates 3 are moved in the X-axis direction and the negative X-axis direction, the LEDs are transferred to the target substrates 3, and the LEDs are not transferred when the target substrates 3 are moved in the Y-axis direction. However, the disclosure is not limited thereto. For example, the LED transfer system 1 may be provided so that, when the target substrates 3 are moved in the Y-axis direction and the negative Y-axis direction, the LEDs are transferred to the target substrates 3, and when the target substrates 3 are moved in the X-axis direction, the LEDs are not transferred to the target substrates 3. In other words, the LED transfer system 1 according to an embodiment may be configured to transfer the LEDs to the target substrates 3 when the target substrates 3 move in the first direction, and not to transfer the LEDs to the target substrates 3 when the target substrates 3 move in the second direction perpendicular to the first direction.

In addition, the LED transfer system 1 according to an embodiment may increase the number of LEDs that may be transferred at one time compared to the LED transfer system according to the prior art. This will be described in detail with reference to FIGS. 11 and 12.

Figure 11:
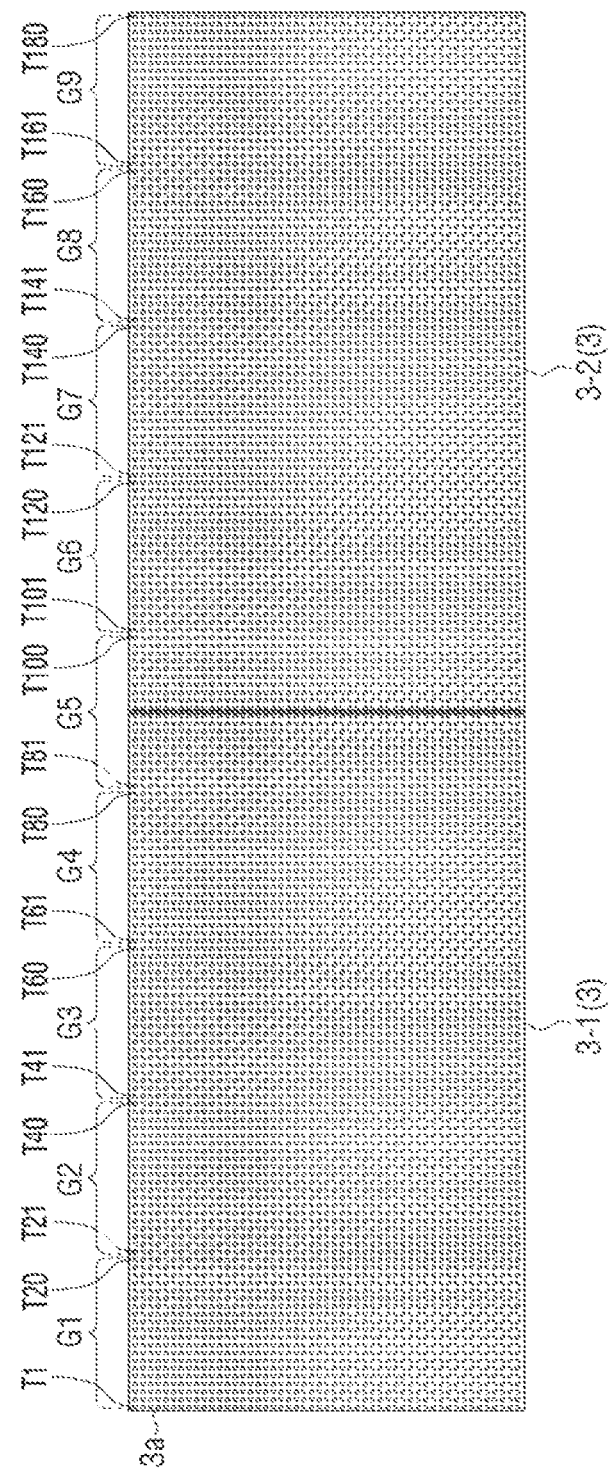
FIG. 11 is a view for explaining the number of LEDs that can be transferred at one time by an LED transfer system according to an embodiment.
Figure 12:
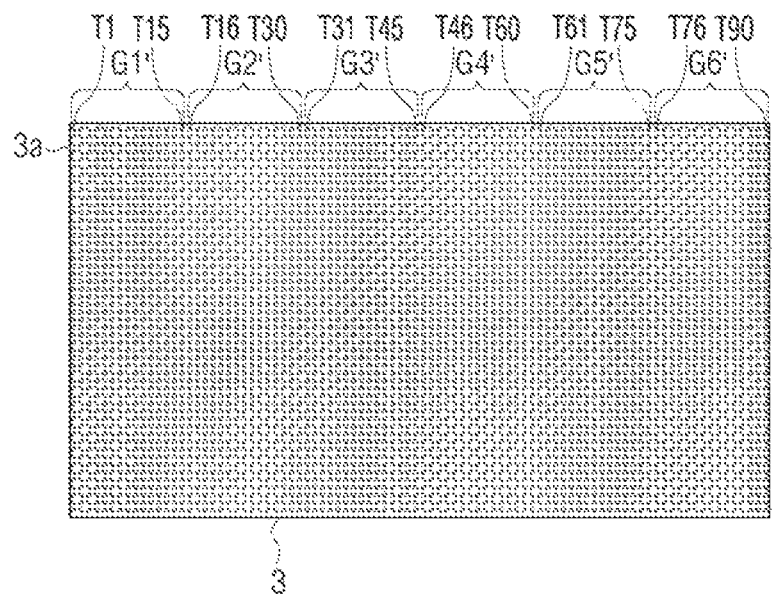
FIG. 12 is a view for explaining the number of LEDs that can be transferred at one time by an LED transfer system according to the prior art.

FIG. 11 is a diagram for explaining the number of LEDs that can be transferred at one time by an LED transfer system according to an embodiment. FIG. 12 is a diagram for explaining the number of LEDs that can be transferred at one time by an LED transfer system according to the prior art.

Referring to FIG. 11, the target substrate 3 may be formed so that 90 LEDs are disposed in one row. Therefore, when two target substrates 3 are adjacent in the horizontal direction, 180 LEDs may be disposed in one row on the two target substrates 3. For reference, in the LED transfer system 1 according to an embodiment, four target substrates 3 are fixed to the transfer stage 30, but in FIG. 11, only two target substrates 3 are illustrated for convenience of illustration.

When transferring the LEDs 5 of the relay substrate 41 to the target substrates 3 with a laser beam, transferring as many LEDs 5 as possible at one time may reduce the transfer time. Therefore, the size of the laser beam for transferring the LEDs 5 may be determined to transfer at once the number of LEDs corresponding to the greatest divisor of the number of connection terminals 3a of the target substrates 3 within the size of the maximum laser beam that may be emitted by the laser apparatus 50.

In the LED transfer system 1 according to an embodiment, the horizontal distance H1 (see FIG. 5) between two adjacent connection terminals 3a of two target substrates 3 adjacent in the X-axis direction fixed to the transfer stage 30 is equal to the horizontal distance H (see FIG. 5) between two adjacent connection terminals 3a in the inside of each of the target substrates 3. Accordingly, when transferring the LEDs 5 from the relay substrate 41, the two target substrates 3-1 and 3-2 adjacent in the X-axis direction may be treated as a single long target substrate.

Therefore, when the maximum size of the laser beam that may be emitted by the laser apparatus 50 is capable of transferring 29 LEDs at a time, in the LED transfer system 1 according to an embodiment, the laser apparatus 50 may be set to irradiate a laser beam having a size capable of transferring 20 LEDs at a time from the relay substrate 41 to the target substrates 3. In other words, because the two target substrates 3 fixed to the transfer stage 30 according to an embodiment may be handled as one target substrate 3, the number of connection terminals 3a of the target substrate 3 is 180. Because the maximum size of the laser beam that may be emitted by the laser 50 is a size corresponding to 29 LEDs, the laser apparatus 50 may be set to irradiate a laser beam with a size capable of transferring 20 LEDs at once. Accordingly, in order to transfer the LEDs to all of the connection terminals 3a in one row of the two target substrates 3 fixed to the transfer stage 30, the laser 50 may emit the laser beam 9 times.

When the laser apparatus 50 emits the laser beam, 20 LEDs are transferred from the relay substrate 41 to the target substrates 3 at a time. The plurality of LEDs of the relay substrate 41 may be sequentially transferred to the two adjacent target substrates 3 by 20 pieces.

For example, as shown in FIG. 11, the first 20 LEDs G1 are transferred to 20 connection terminals 3a from the first connection terminal T1 to the 20th connection terminal T20 of the first target substrate 3-1. The next 20 LEDs G2 are transferred to 20 connection terminals 3a from the 21st connection terminal T21 to the 40th connection terminal T40 of the first target substrate 3-1. The next 20 LEDs G3 are transferred to 20 connection terminals 3a from the 41st connection terminal T41 to the 60th connection terminal T60 of the first target substrate 3-1. The next 20 LEDs G4 are transferred to 20 connection terminals 3a from the 61st connection terminal T61 to the 80th connection terminal T80 of the first target substrate 3-1. The next 20 LEDs G5 are transferred to 20 connection terminals 3a from the 81st connection terminal T81 of the first target substrate 3-1 to the 100th connection terminal T100 of the second target substrate 3-2. The next 20 LEDs G6 are transferred to 20 connection terminals 3a from the 101st connection terminal T101 to the 120th connection terminal T120 of the second target substrate 3-2. The next 20 LEDs G7 are transferred to 20 connection terminals 3a from the 121st connection terminal T121 to the 140th connection terminal T140 of the second target substrate 3-2. The next 20 LEDs G8 are transferred to 20 connection terminals 3a from the 141st connection terminal T141 to the 160th connection terminal T160 of the second target substrate 3-2. Finally, the 20 LEDs G9 are transferred to 20 connection terminals 3a from the 161st connection terminal T161 to the 180th connection terminal T180 of the second target substrate 3-2.

In the LED transfer system according to the prior art, because a single target substrate 3 is fixed to the transfer stage 130, the laser apparatus 150 may be set to emit a laser beam having a size capable of transferring 15 LEDs from the relay substrate to the target substrate 3 at a time. In other words, in the LED transfer system according to the prior art, the number of connection terminals 3a of the target substrate 3 fixed to the transfer stage 130 is 90. Because the maximum size of the laser beam that may be emitted by the laser apparatus 150 is a size corresponding to 29 LEDs, the laser apparatus 150 may be set to irradiate a laser beam with a size capable of transferring 15 LEDs at once. Accordingly, in order to transfer the LEDs to all of the connection terminals 3a in one row of the one target substrate 3 fixed to the transfer stage 130, the laser apparatus 150 may irradiate the laser beam six (6) times.

Accordingly, when the laser beam is emitted from the laser apparatus 150, 15 LEDs are transferred from the relay substrate to the target substrate 3 at a time. The plurality of LEDs of the relay substrate are sequentially transferred to the target substrate 3 by 15 pieces.

In detail, as shown in FIG. 12, the first 15 LEDs G1' are transferred to 15 connection terminals 3a from the first connection terminal T1 to the 15th connection terminal T15 of the target substrate 3. The next 15 LEDs G2' are transferred to 15 connection terminals 3a from the 16th connection terminal T16 to the 30th connection terminal T30 of the target substrate 3. The next 15 LEDs G3' are transferred to 15 connection terminals 3a from the 31st connection terminal T31 to the 45th connection terminal T45 of the target substrate 3. The next 15 LEDs G4' are transferred to 15 connection terminals 3a from the 46th connection terminal T46 to the 60th connection terminal T60 of the target substrate 3. The next 15 LEDs G5' are transferred to 15 connection terminals 3a from the 61st connection terminal T61 to the 75th connection terminal T75 of the target substrate 3. Finally, the 15 LEDs G6' are transferred to 15 connection terminals 3a from the 76th connection terminal T76 to the 90th connection terminal T90 of the target substrate 3.

As described above, in the LED transfer system according to the prior art, because the laser beam is emitted six times to transfer the LEDs to all the connection terminals 3a of one row of one target substrate 3, the laser beam is emitted 12 times to transfer the LEDs to all the connection terminals 3a of one row of two target substrates 3. However, in the LED transfer system 1 according to an embodiment of the disclosure, because the laser beam is emitted 9 times in order to transfer the LEDs to all the connection terminals 3a of one row of two target substrates 3, the transfer time may be reduced.

Hereinafter, a control method of an LED transfer system 1 according to an embodiment for transferring a plurality of LEDs to a target substrates 3 will be described with reference to FIG. 13.

Figure 13:
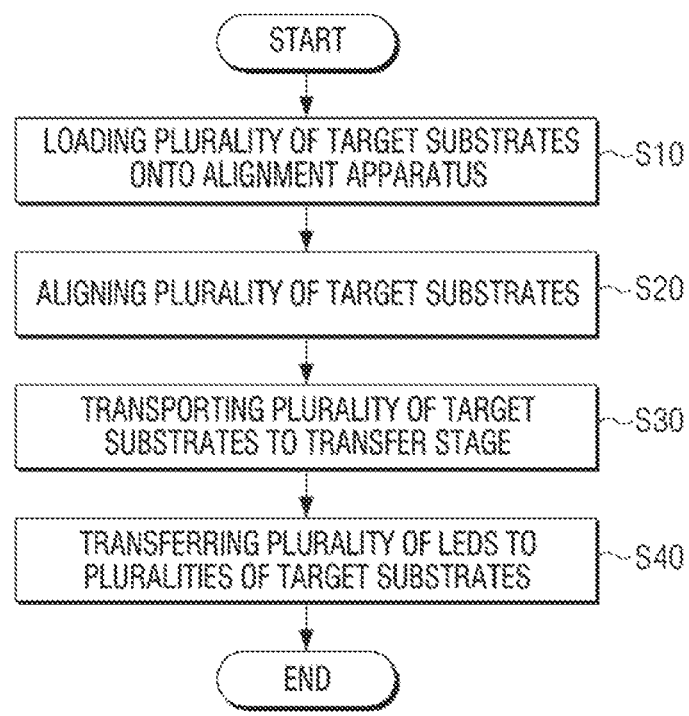
FIG. 13 is a flowchart illustrating a control method of an LED transfer system according to an embodiment for transferring a plurality of LEDs.

FIG. 13 is a flowchart of a control method of an LED transfer system according to an embodiment for transferring a plurality of LEDs.

First, a plurality of target substrates 3 are loaded onto a alignment apparatus 10 (S10). The plurality of target substrates 3 may be loaded onto the alignment apparatus 10 from a substrate cassette by a substrate loading apparatus. The substrate cassette may accommodate a plurality of target substrates 3 and may be disposed adjacent to the alignment apparatus 10. The processor 90 may be configured to control the substrate cassette and the substrate loading apparatus to load the plurality of target substrates 3 onto the alignment apparatus 10.

Next, the alignment apparatus 10 may align the plurality of target substrates 3 (S20). The alignment apparatus 10 may align the plurality of target substrates 3 fixed to the plurality of pins 15 using the plurality of alignment supports 13 and the first image sensor 18. In other words, the alignment apparatus 10 aligns the plurality of target substrates 3, so that the horizontal distance H1 and the vertical distance V1 between two adjacent connection terminals 3a of two adjacent target substrates 3 are equal to the horizontal distance H and the vertical distance V between the two adjacent connection terminals 3a inside one target substrate 3. A method of aligning the plurality of target substrates 3 by the alignment apparatus 10 has been described above, and a detailed description thereof is omitted.

When the alignment of the plurality of target substrates 3 is completed, the processor 90 may control the handling robot 20 to move the plurality of target substrates 3 to the transfer stage 30 (S30). In other words, the handling robot 20 transports the plurality of target substrates 3 aligned by the alignment apparatus 10 to the transfer stage 30 at a time while maintaining the aligned state. For example, when the alignment apparatus 10 is formed to align the four target substrates 3 as shown in FIG. 3, the handling robot 20 grips the aligned four target substrates 3 at a time with the gripper 21, and transports the four target substrates 3 to the transfer stage 30. In this case, the gripper 21 is formed to hold the four target substrates 3 so that the alignment of the four target substrates 3 is maintained.

Hereinafter, a method in which the processor 90 controls the handling robot 20 to transport the plurality of target substrates 3 from the alignment apparatus 10 to the transfer stage 30 will be described in detail with reference to FIG. 14.

FIG. 14 is a flowchart of a method for a handling robot to move a plurality of target substrates from an alignment apparatus to a transfer stage in a control method of an LED transfer system according to an embodiment.

When the alignment apparatus 10 completes the alignment of the plurality of target substrates 3, the processor 90 may control the handling robot 20 to place the gripper 21 under the plurality of target substrates 3 aligned in the alignment apparatus 10 (S31). Then, the gripper 21 of the handling robot 20 is positioned between the plurality of target substrates 3 and the base 11.

Next, the processor 90 may control the handling robot 20 to affix the plurality of target substrates 3 to the gripper 21 (S32). For example, when the processor 90 operates the second vacuum sucker of the handling robot 20, the gripper 21 may adsorb the plurality of target substrates 3 while maintaining the alignment of the plurality of target substrates 3. When the handling robot 20 adsorbs the plurality of target substrates 3, the processor 90 turns off the first vacuum sucker 17 of the alignment apparatus 10. Then, the handling robot 20 may lift the plurality of target substrates 3 from the alignment apparatus 10.

Subsequently, the processor 90 may control the handling robot 20 so that the handling robot 20 moves the gripper 21 to position the plurality of target substrates 3 in the transfer stage 30 (S33). In detail, the handling robot 20 may lift the plurality of target substrates 3 from the plurality of pins 15 of the alignment apparatus 10, and then transport the plurality of target substrates 3 to the transfer stage 30. At this time, the handling robot 20 may position the plurality of target substrates 3 on the plurality of fixing pins 35 of the transfer stage 30.

Next, the processor 90 may control the transfer stage 30 so that the transfer stage 30 adsorbs the plurality of target substrates 3 (S34). In detail, when the processor 90 turns on the third vacuum sucker 37 of the transfer stage 30, the plurality of target substrates 3 are adsorbed onto the plurality of fixing pins 35 of the transfer stage 30. When the plurality of target substrates 3 are fixed by the plurality of fixing pins 35, the processor 90 turns off the second vacuum sucker of the handling robot 20. Then, the adsorption of the plurality of target substrates 3 by the gripper 21 of the handling robot 20 is released.

Finally, the processor 90 controls the handling robot 20 to retreat the gripper 21 (S35). In detail, the handling robot 20 retracts the gripper 21 to an evacuation position that does not interfere with the transfer stage 30.

When the plurality of target substrates 3 are transported to the transfer stage 30 by the handling robot 20 and the gripper 21 is located in the evacuation position, the processor 90 controls the laser apparatus 50, the substrate stage 40, and the transfer stage 30, thereby transferring the plurality of LEDs in the substrate stage 40 to the plurality of target substrates 3 in the transfer stage 30 (S40). In detail, the processor 90 allows the plurality of LEDs of the relay substrate 41 mounted on the substrate stage 40 to face the plurality of target substrates 3 fixed to the transfer stage 30. Thereafter, when the processor 90 operates the laser apparatus 50, the laser beam is emitted so that the number of LEDs 5 corresponding to the size of the laser beam is transferred from the relay substrate 41 to the target substrates 3.

The processor 90 may control the transfer stage 30 so that the plurality of target substrates 3 are moved in a zigzag manner with respect to the laser apparatus 50, while the laser apparatus 50 irradiates the laser beam to a predetermined portion of the relay substrate 41. Then the plurality of LEDs 5 are transferred from the relay substrate 41 to the plurality of target substrates 3.

For example, the processor 90 may control the transfer stage 30 to move the plurality of target substrates 3 in the X-axis direction from the front end of the first target substrate 3 of at least two target substrates 3 aligned in the X-axis direction among the plurality of target substrates 3 to the rear end of the last target substrate 3 thereof (see FIG. 9). At this time, the processor 90 may control the laser apparatus 50 to irradiate a laser beam, so that the plurality of LEDs of the relay substrate 41 are transferred to the first row R1 of the plurality of target substrates 3 (first transfer operation).

Subsequently, the processor 90 may control the transfer stage 30 so that the plurality of target substrates 3 are moved a predetermined distance in the Y-axis direction perpendicular to the X-axis direction (first moving operation) (see FIG. 9). At this time, the distance that the plurality of target substrates 3 are moved in the Y-axis direction is the vertical distance V between the plurality of connection terminals 3a of the target substrate 3. In other words, the plurality of target substrates 3 are moved in the Y-axis direction by the distance between the first row R1 and the second row R2 of the target substrate 3.

Next, the processor 90 may control the transfer stage 30 to move the plurality of target substrates 3 from the rear end of the last target substrate 3 to the front end of the first target substrate 3 in a direction opposite to the X-axis direction (see FIG. 9). At this time, the processor 90 may control the laser apparatus 50 to irradiate a laser beam, so that the plurality of LEDs of the relay substrate 41 are transferred to the second row R2 of the plurality of target substrates 3 (second transfer operation).

Subsequently, the processor 90 controls the transfer stage 30 so that the plurality of target substrates 3 are moved a predetermined distance in the Y-axis direction perpendicular to the X-axis direction (second moving operation) (see FIG. 9). In other words, the processor 90 may move the plurality of target substrates 3 in the Y-axis direction by the distance between the second row R2 and the third row R3 of the target substrate 3.

The processor 90 may repeatedly performs the above-described first transfer operation, the first moving operation, the second transfer operation, and the second moving operation until the plurality of LEDs are transferred to all the plurality of target substrates 3.

Alternatively, the methods according to the embodiments as described above may be implemented in the form of an application installable on an existing LED transfer apparatus (or system).

In addition, the methods according to the embodiments as described above may be implemented by upgrading software or hardware of the existing LED transfer apparatus (or system).

In addition, the embodiments described above may also be performed through an embedded server included in the LED transfer system 1, or an external server of the LED transfer system 1.

The embodiments described above may be implemented in a computer or a computer-readable medium using software, hardware, or a combination of software and hardware. In some cases, the embodiments described in the disclosure may be implemented by the processor 90 itself. According to a software implementation, the embodiments such as procedures and functions described in the disclosure may be implemented as separate software modules. Each of the software modules may perform one or more functions and operations described in the disclosure.

Computer instructions for performing processing operations of the LED transfer system 1 according to the embodiments as described above may be stored in a non-transitory computer-readable medium. The computer instructions stored in the non-transitory computer-readable medium allow a specific device to perform the processing operations of the LED transfer system 1 according to the embodiments described above based on being executed by a processor of the specific device.

The non-transitory computer-readable medium refers to a machine-readable medium that semi-permanently stores data rather than a medium that stores data for a short moment, such as a register, cache, a memory, or the like. A specific example of the non-transitory computer-readable medium may include a compact disk (CD), a digital versatile disk (DVD), a hard disk, a Blu-ray disk, a universal serial bus (USB), a memory card, a read only memory (ROM), or the like.

Although the embodiments have been individually described hereinabove, the respective embodiments are not necessarily implemented in a discrete manner, but the configurations and operations of each of the embodiments may be implemented in combination with at least one other embodiment.

Although the embodiments of the disclosure have been illustrated and described hereinabove, the disclosure is not limited to the above-mentioned specific embodiments, but may be variously modified by those skilled in the art to which the disclosure pertains without departing from the scope and spirit of the disclosure as claimed in the accompanying claims. Such modifications should not be individually understood from the technical spirit or the prospect of the disclosure.

What is claimed is:

1. A light emitting diode transfer system comprising:
an alignment apparatus configured to align a plurality of target substrates;
a handling robot configured to transport the plurality of target substrates aligned in the alignment apparatus while maintaining an aligned state;
a transfer stage configured to hold the plurality of target substrates transported by the handling robot and move the plurality of target substrates;
a substrate stage configured to move a relay substrate having a plurality of light emitting diodes (LEDs) to be transferred to the plurality of target substrates with respect to the transfer stage while the plurality of LEDs are facing the transfer stage;
a laser configured to emit a laser beam toward the plurality of LEDs of the relay substrate disposed on the substrate stage so that the plurality of LEDs are transferred from the relay substrate to the plurality of target substrates; and
a processor configured to control the alignment apparatus, the handling robot, the transfer stage, the substrate stage, and the laser to transfer the plurality of LEDs of the relay substrate to the plurality of target substrates.

2. The light emitting diode transfer system as claimed in claim 1, wherein the alignment apparatus comprises:
a base; and
a plurality of alignment supports provided on an upper side of the base, and configured to support the plurality of target substrates and adjust each of the plurality of target substrates in an X-axis direction, a Y-axis direction, a Z-axis direction, and a θ direction.

3. The light emitting diode transfer system as claimed in claim 2, wherein each of the plurality of alignment supports comprises a plurality of pins that affix a target substrate to the base and space the affixed target substrate from the base.

4. The light emitting diode transfer system as claimed in claim 3, wherein the plurality of pins adsorb and affix the plurality of target substrates by vacuum suction.

5. The light emitting diode transfer system as claimed in claim 1, wherein the handling robot comprises a gripper capable of gripping each of the plurality of target substrates at once.

6. The light emitting diode transfer system as claimed in claim 5, wherein the gripper is configured to adsorb the target substrates without contacting a plurality of pins that protrude from a base of the alignment apparatus and support the plurality of target substrates.

7. The light emitting diode transfer system as claimed in claim 5, wherein the gripper adsorbs and affixes the plurality of target substrates by vacuum suction.

8. The light emitting diode transfer system as claimed in claim 1, wherein the transfer stage comprises:

a transfer base configured to be movable in an X-axis direction and a Y-axis direction; and a plurality of fixing pins protruding from the transfer base and configured to affix the plurality of target substrates transported by the handling robot.

9. The light emitting diode transfer system as claimed in claim 8, wherein the plurality of fixing pins adsorb and affix the plurality of target substrates by vacuum suction.

10. The light emitting diode transfer system as claimed in claim 8, wherein the transfer stage further comprises a image sensor for aligning the plurality of target substrates, affixed by the plurality of fixing pins, with respect to the laser.

11. The light emitting diode transfer system as claimed in claim 1, wherein the processor controls the transfer stage so that the plurality of target substrates are moved along a zigzag path with respect to the laser, and wherein a moving length of the zigzag path in a X-axis direction corresponds to a length of at least two target substrates aligned in the X-axis direction among the plurality of target substrates, and a moving length of the zigzag path in a Y-axis direction corresponds to a vertical distance between adjacent connection terminals of the plurality of target substrates.

12. The light emitting diode transfer system as claimed in claim 1, wherein the processor is further configured to control the transfer stage, the substrate stage, and the laser to sequentially transfer a plurality of red LEDs, a plurality of green LEDs, and a plurality of blue LEDs to the plurality of target substrates.

13. A control method of a light emitting diode transfer system, the control method comprises:

loading a plurality of target substrates onto an alignment apparatus;

aligning the plurality of target substrates by the alignment apparatus;

transporting, by a handling robot, the plurality of target substrates aligned by the alignment apparatus to a transfer stage while maintaining an aligned state; and transferring a plurality of light emitting diodes (LEDs) on a substrate stage to the plurality of target substrates of the transfer stage by operating a laser the substrate stage, and the transfer stage.

14. The control method as claimed in claim 13, wherein the transporting, by the handling robot, the plurality of target substrates aligned by the alignment apparatus to the transfer stage while maintaining the aligned state comprises:

positioning, by the handling robot, a gripper under the plurality of target substrates aligned in the alignment apparatus;

affixing the plurality of target substrates to the gripper;

moving, by the handling robot, the gripper to position the plurality of target substrates in the transfer stage;

affixing the plurality of target substrates to the transfer stage; and retracting the gripper by the handling robot.

15. The control method as claimed in claim 13, wherein the transferring the plurality of LEDs affixed to the substrate stage to the plurality of target substrates of the transfer stage comprises:

a first transfer operation of transferring a plurality of LEDs of a relay substrate to a first row of the plurality of target substrates by emitting a laser beam from the laser while the plurality of target substrates are moving in a first direction from a front end of a first target substrate of at least two target substrates aligned in the first direction among the plurality of target substrates to a rear end of a last target substrate of the at least two target substrates aligned in the first direction;

a first moving operation of moving the plurality of target substrates by a predetermined distance in a second direction perpendicular to the first direction;

a second transfer operation of transferring a plurality of LEDs of the relay substrate to a second row of the plurality of target substrates by emitting a laser beam from the laser apparatus while the plurality of target substrates are moving in a direction opposite to the first direction from the rear end of the last target substrate to the front end of the first target substrate;

a second moving operation of moving the plurality of target substrates by the predetermined distance in the second direction; and repeating the first transfer operation, the first moving operation, the second transfer operation, and the second moving operation until LEDs are transferred to all the plurality of target substrates.

16. A non-transitory computer-readable recording medium comprising:

a program for executing a control method of a light emitting diode (LED) transfer system, wherein the control method of the LED transfer system comprises:

loading a plurality of target substrates onto an alignment apparatus;

aligning the plurality of target substrates by the alignment apparatus;

transporting, by a handling robot, the plurality of target substrates aligned by the alignment apparatus to a transfer stage while maintaining an aligned state; and transferring a plurality of LEDs in a substrate stage to the plurality of target substrates of the transfer stage by operating a laser, the substrate stage, and the transfer stage.

* * * * *